United States Patent
Bryan et al.

(10) Patent No.: US 6,276,055 B1
(45) Date of Patent: Aug. 21, 2001

(54) METHOD AND APPARATUS FOR FORMING PLUGS IN VIAS OF A CIRCUIT BOARD LAYER

(75) Inventors: Scott K. Bryan, San Jose; Nicholas Biunno, Santa Clara, both of CA (US)

(73) Assignee: Hadco Santa Clara, Inc., Santa Clara, CA (US)

( * ) Notice: Subject to any disclaimer, the term of this patent is extended or adjusted under 35 U.S.C. 154(b) by 0 days.

(21) Appl. No.: 09/159,429

(22) Filed: Sep. 24, 1998

Related U.S. Application Data
(60) Provisional application No. 60/098,819, filed on Sep. 2, 1998.

(51) Int. Cl.[7] .................................................. H01K 3/10
(52) U.S. Cl. .............................. 29/852; 29/830; 29/853; 427/97
(58) Field of Search ........................... 29/825, 830, 852, 29/853; 427/97

(56) References Cited

U.S. PATENT DOCUMENTS

| | | |
|---|---|---|
| 3,601,523 | 8/1971 | Arndt . |
| 4,283,243 * | 8/1981 | Andreades et al. . |
| 4,360,570 * | 11/1982 | Andreades et al. . |
| 4,700,474 * | 10/1987 | Choinski ........................ 29/846 |
| 4,777,721 * | 10/1988 | Choinski ........................ 29/846 |
| 4,783,247 * | 11/1988 | Seibel . |
| 4,884,337 * | 12/1989 | Choinski ........................ 29/846 |
| 4,964,948 | 10/1990 | Reed ............................ 156/659.1 |
| 5,220,723 | 6/1993 | Okada .............................. 29/830 |
| 5,274,916 | 1/1994 | Kawabata et al. ................ 29/848 |
| 5,456,004 | 10/1995 | Swamy ............................ 29/852 |
| 5,591,353 | 1/1997 | Davignon et al. ................ 216/18 |
| 5,699,613 | 12/1997 | Chong et al. .................... 29/852 |
| 5,744,285 | 4/1998 | Felten et al. ................... 430/318 |
| 5,761,803 | 6/1998 | St. John et al. ................. 29/852 |
| 5,822,856 | 10/1998 | Bhatt et al. ..................... 29/832 |
| 5,906,042 * | 5/1999 | Lan et al. ........................ 29/852 |
| 6,000,129 | 12/1999 | Bhatt et al. ..................... 29/852 |
| 6,009,620 | 1/2000 | Bhatt et al. ..................... 29/852 |

FOREIGN PATENT DOCUMENTS

| | | | |
|---|---|---|---|
| 0194247 | 9/1986 | (EP) | ............... H05K/3/42 |
| 0723388 | 7/1996 | (EP) | ............... H05K/3/40 |
| 2684836 | 6/1993 | (FR) | ............... H05K/3/42 |
| 2714567 | 6/1995 | (FR) | ............... H05K/3/42 |
| 2120017 | 11/1983 | (GB) | ............... H05K/3/06 |
| 2246912 | 2/1992 | (GB) | ............... H05K/3/42 |
| 58-11172 * | 1/1983 | (JP) . | |
| 1-173696 * | 7/1989 | (JP) . | |
| 01236694 | 9/1989 | (JP) | ............... H05K/3/40 |
| 04239193 | 8/1992 | (JP) | ............... H05K/3/40 |
| 5-275819 | 10/1993 | (JP) . | |
| 86/06243 | 10/1986 | (WO) | ............... H05K/3/34 |

* cited by examiner

Primary Examiner—Carl J. Arbes
(74) Attorney, Agent, or Firm—Testa Hurwitz & Thibeault, LLP

(57) ABSTRACT

A method of forming one or more plugs in a circuit board layer is described which includes providing the circuit board layer, the circuit board layer having a first surface, a second surface, and defining a via containing a plug material in a volatile solvent, evaporating the volatile solvent, and curing the plug material. A product made according to the above method is also described.

20 Claims, 2 Drawing Sheets

METHOD AND APPARATUS FOR FORMING PLUGS IN VIAS OF A CIRCUIT BOARD LAYER

RELATED APPLICATION

This application claims the benefit of U.S. Provisional Patent Application Ser. No. 60/098,819, filed Sep. 2, 1998, the entire disclosure of which is incorporated by reference herein.

FIELD OF THE INVENTION

The present invention relates generally to circuit board layers, and more specifically to a method and apparatus for forming plugs in one or more vias defined by a circuit board layer, and the product obtained using this method.

BACKGROUND OF THE INVENTION

Circuit board through-holes are commonly plated or filled with conductive material in order to provide for the transfer of electrical signals from one surface of the circuit board layer to a second surface of the circuit board layer.

Filled through-holes are typically through-holes which receive contacts or pins of some element external to the circuit board. The through-holes are typically filled manually with a molten conductive material, to both physically and electrically connect the external element to the circuit board. It is also known to form a plug in the through-holes by a method which includes filling the through-holes with a first layer of conductive material, curing this layer, planarizing the circuit board layer to remove the conductive material cured to the surface of the circuit board layer, filling the through-holes with a second conductive material, and curing this second material. Both of these methods are time-consuming and expensive. Furthermore, not only does the latter method require several filling steps, but it also involves a substantial alteration of the surface of the circuit board layer in order to remove the conductive material that is cured onto the surface of the circuit board layer.

Plated through-holes generally involve electroless copper plating which is expensive and only coats the inside surface of the through-holes. It is known to form a thin meniscus of non-conductive or dielectric material within a via plated with conductive material using a screen without a stencil. This is typically done to allow vacuum hold down of circuit boards for testing, or to prevent assembly materials from propagating from one side of the circuit board to the other, but may be done for other reasons as well. However, the meniscus formed is susceptible to corrosion, thus decreasing the yield of acceptable circuit boards and increasing their cost.

Finally, methods of forming plugs in circuit board layers which result in significant alteration of the surfaces of circuit board layer is a disadvantage, particularly if it is desirable to print the circuit board prior to plug formation.

Therefore, there exists a need in the art for a method and apparatus to quickly and efficiently form plugs in circuit board through-holes at an acceptable yield and cost. There is a further need for a method of forming plugs in circuit board through-holes without significantly altering either surface of the circuit board layer. Finally, there exists a need in the art for a method to provide a plug with minimal voids formed therein.

SUMMARY OF THE INVENTION

This invention provides a novel method and apparatus for forming plugs in vias of a circuit board layer, and the novel product produced by this novel method.

In one aspect, the present invention provides a novel method of forming one or more plugs in a circuit board layer. First, a circuit board layer is provided, the circuit board layer having a first surface, a second surface, and defining a via containing a plug material in a volatile solvent. The volatile solvent is then evaporated. This may be accomplished at a controlled rate so that the presence of voids in the resulting plug is minimized. In one embodiment, plug material present on the first surface and the second surface of the circuit board layer is substantially removed without causing a significant alteration of either surface of the circuit board layer. Finally, the plug material is cured to form a plug contained within the via defined by the circuit board layer in the case of a conductive plug, or defined by the plated circuit board layer in the case of a non-conductive plug.

In another aspect, the circuit board layer including the plug formed therein is described in terms of the novel method described above.

In yet another aspect, the present invention provides a novel apparatus for filling the one or more of a plurality of vias formed in a circuit board layer. This apparatus is called a fixture and it includes a planar template and an air permeable layer. The template has a first surface, a second surface, and defines one or more through-holes corresponding in position to the one or more vias defined by the circuit board layer. The air permeable layer is disposed on the second surface of the template. In a preferred embodiment, this air permeable layer is substantially impermeable to the plug material so that the plug material is substantially contained within the fixture.

BRIEF DESCRIPTION OF THE DRAWINGS

The invention is pointed out with particularity in the appended claims. The drawings are not necessarily to scale, emphasis instead generally being placed upon illustrating the principles of the invention. The advantages of the invention described above, as well as further advantages of the invention, may be better understood by reference to the following description taken in conjunction with the accompanying drawings, in which:

DETAILED DESCRIPTION OF PREFERRED EMBODIMENTS

In order to more clearly and concisely describe the subject matter of the claims, the following definitions are intended to provide guidance as to the meaning of specific terms used in the following written description, examples and appended claims.

As used herein the term "via" means a through-hole formed in a circuit board layer. Vias are commonly used for the transfer of electrical signals from one side of a circuit board layer to the other side by plating the side walls of the via or filling the via with a conductive material. As used herein the term "conductive material" means any material that includes a substance that is capable of transmitting electrical signals. As used herein the term "non-conductive material" or "dielectric material" means any material that is not capable of transmitting electrical signals.

Figure 1:
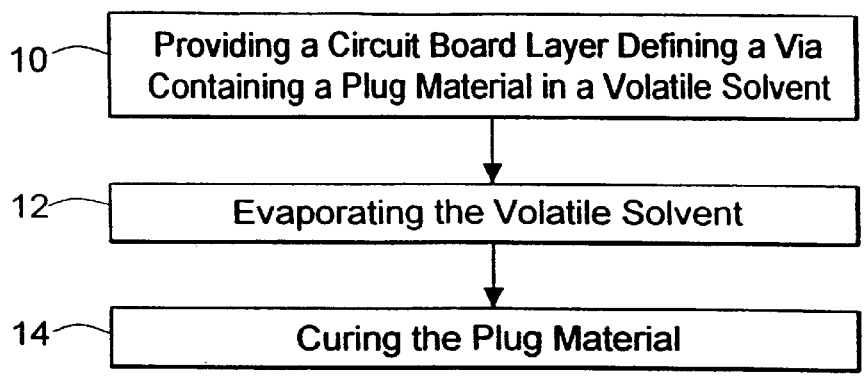
FIG. 1 is a flowchart diagram illustrating an embodiment of a method of forming one or more plugs in a circuit board layer in accordance with the present invention.

FIG. 1 is a flowchart diagram illustrating a method of forming one or more plugs in a circuit board layer. The method includes, in overview, of: providing the printed circuit board layer, the circuit board layer having a first surface, a second surface, and defining a via containing a plug material in a volatile solvent (step 10); evaporating the volatile solvent (step 12); and curing the plug material (step 14).

In step 10 a circuit board layer is provided. The circuit board may be a double sided, multilayer or rigid-flex circuit board. The circuit board may be printed or unprinted. The circuit board layer defines one or more vias containing a plug material in a volatile solvent. The plug material may be conductive or non-conductive. Compounds such as solder masks, for example, HYSOL® SR1000 or HYSOL® SR1010 solder masks made by Dexter Corporation, which have a viscosity of about 30,000 centipoise (cP), are suitable for use as a non-conductive material. Polymer-based plug material, such as SD2361 made by Lackerwerke Peters having a viscosity of from about 26,000 to about 37,000 cP, is suitable for use as a non-conductive material. Polymer-based compounds such as CB100 made by DuPont, Inc. are also suitable for conductive material. Other equivalent substances would also be suitable.

In step 12, the volatile solvent is evaporated from the conductive material. Preferably, the solvent is evaporated at a controlled rate, such that the creation of voids in the plug material is minimized. The rate of evaporation is controlled by drying at a temperature high enough to drive off the volatile solvent without bubble formation. That is, it is preferred that the volatile solvent bleeds out of the plug material with minimal bubble formation. If bubbles are formed in the plug material, during the cure, or other subsequent steps in which the circuit board is exposed to high temperatures, any air or solvent trapped in the voids may expand and cause the material surrounding the void to crack, break, or in extreme cases, explode. The solvent may be evaporated at a temperature from about 40° C. to about 100° C., and preferably from about 60° C. to about 90° C. The most preferred temperature for each plug material will vary depending on the volatile solvent used therein. The plug material may be dried for about 30 minutes to about 90 minutes, preferably for about 45 minutes to about 75 minutes and most preferably for about 60 minutes, and will vary depending on the drying temperature and the amount of volatile solvent in the plug material.

Finally, in step 14 the plug material is cured. The cure temperature is typically in the range of from about 130° C. to about 180° C. degrees, more preferably between about 150° C. and about 170° F., and will vary depending on the chemistry of the material used. The optimal cure temperature for a particular material is typically supplied to the user by the manufacturer of the material. The plug material should be cured for about 30 minutes to about 90 minutes, preferably for about 60 minutes.

Figure 2:
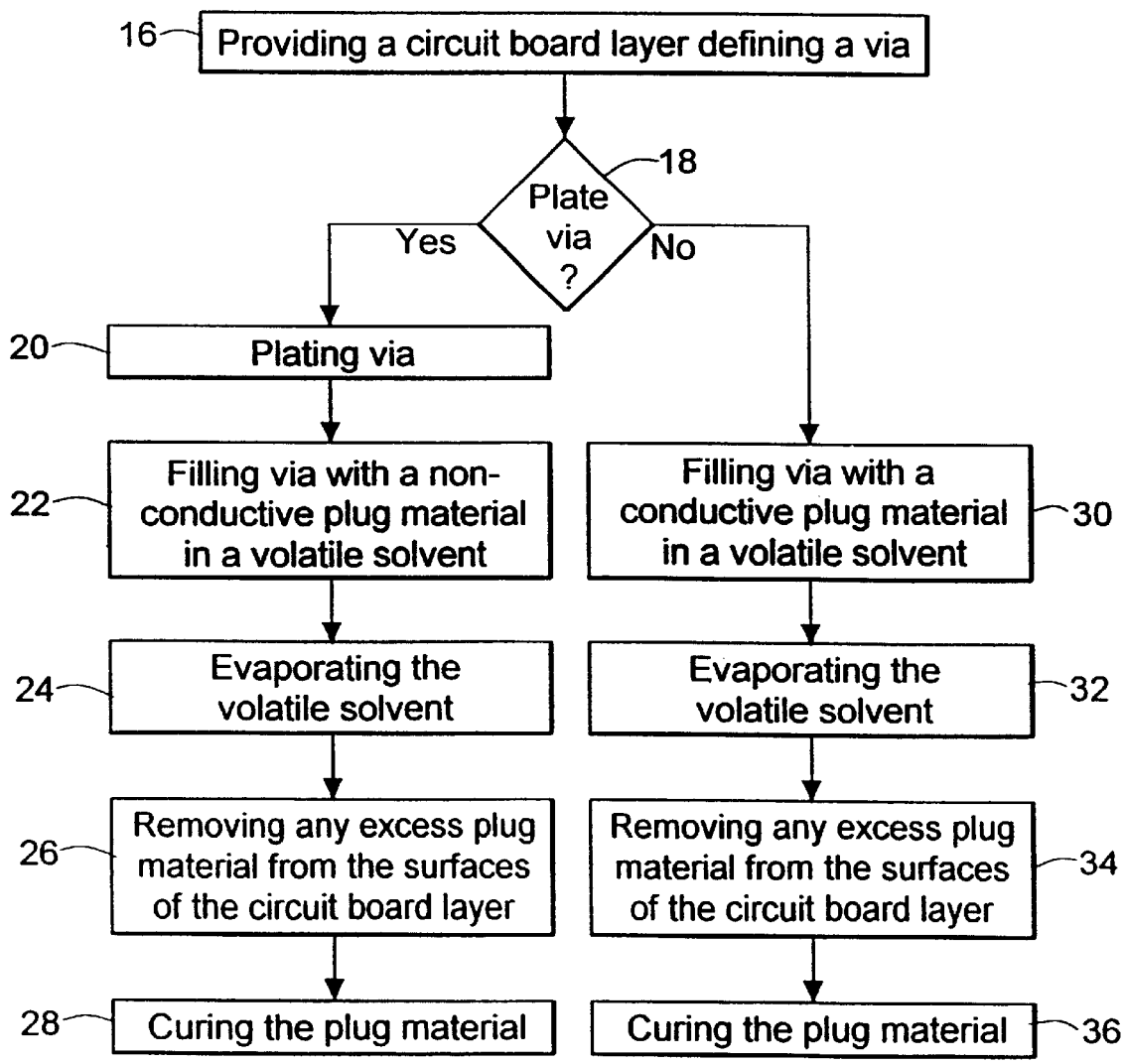
FIG. 2 is a flowchart diagram illustrating another embodiment of a method of forming one or more plugs in a circuit board layer in accordance with the present invention.

FIG. 2 is a flowchart diagram illustrating another embodiment of a method of forming one or more plugs in a circuit board layer in accordance with the present invention. The method includes, in overview, the initial steps of: providing the printed circuit board layer, the circuit board layer having a first surface, a second surface, and defining a via (step 16); and deciding whether or not to plate the via (step 18). If the via is to be plated, then the remainder of the method includes: plating the via (step 20); filling the via with a non-conductive plug material in a volatile solvent (step 22); evaporating the volatile solvent (step 24); removing any excess plug material from both the first surface and the second surface of the circuit board layer (step 26); and curing the plug material (step 28). If the decision is made not to plate the via, then the remainder of the method includes: filling the via with a conductive plug material in a volatile solvent (step 30); evaporating the volatile solvent (step 32); removing any excess plug material from both the first surface and the second surface of the circuit board layer (step 34); and curing the plug material (step 36).

In step 16 a circuit board layer defining a via is provided. As in FIG. 1, the circuit board may be a double sided, multilayer or rigid-flex circuit board. The circuit board may be printed or unprinted. The circuit board layer defines one or more vias which may be drilled, etched or punched into the circuit board layer.

In step 18 a decision is made as to whether or not to plate the via. This will depend on various factors including the relative cost and thermal properties of the non-conductive plug material, the plating, and the conductive plug material.

If the decision is made to plate the via, the next step (step 20) is to plate the via with a conductive material. Typically the via is plated with copper, but other conductive materials may also be used. Methods of plating are well known in the art. The plated via is then filled with non-conductive plug material in a volatile solvent (step 22). Compounds such as solder masks, for example, HYSOL® SR1000 or HYSOL® SR1010 solder masks, made by Dexter, which have a viscosity of about 30,000 cP, are suitable for use as a non-conductive material.

The volatile solvent in the plug material is then evaporated (step 24) at a controlled rate as described in connection with step 12 of FIG. 1. One advantage of the evaporation step (step 24) is that if this is done at a controlled rate, voids in the plug may be minimized. The evaporation step (step 24) represents a further advantage in that any plug material present on the surfaces of the circuit board from the filling step (step 22), is also dried in the evaporation step (step 24) and may be removed from the surfaces of the circuit board layer without a significant alteration of the surfaces (step 26). Significant alteration occurs, for example, when a conductive trace or portion of a conductive trace printed on the surface of the printed circuit board is removed from the surface of the circuit board layer. When excess plug material is cured to a surface of the circuit board layer, it is typically necessary to significantly alter any traces printed upon the surface, in order to remove the cured plug material. Significant alteration is not necessary with the present invention, because any dried plug material present on the surfaces is easily removed by brushing or wiping it from the surfaces. Thus, if the circuit board layer provided in step 16 is a printed circuit board layer, the plugs may be formed according to this method without destruction of the printed traces.

A nylon brush may be used to remove this excess material from one or both surfaces of the circuit board layer in step 26 without significantly altering the surfaces. For example, if a 1.2 mil trace is laid down upon a surface of the circuit board layer, a nylon roller brush will typically remove only about 0.1 mil of trace material from the surface of the trace, thus leaving a 1.1 mil trace. This alteration is not substantial and is consistent with other surface preparation methods commonly used in circuit board manufacturing processes. Alternatively, the surfaces may be wiped clean of excess plug material.

It is preferred that substantially all of plug material be removed from the surface of the circuit board layer prior to curing the plug material (step 28), so that the plug material is not cured onto the surface of the circuit board layer and thus difficult to remove without significantly altering or planarizing the surface of the circuit board layer. Another advantage of this method is that in removing the excess plug material from the surfaces (step 26), the surface of the plug itself is planarized. This is desirable because often external components will be placed directly over filled vias and, if there is any bulge or bump in the via, the external component will not sit firmly onto its mounting pad or pads creating the potential for dislocation of the component or defective soldering. Finally, the plug material is cured (step 28) as described above in step 14 of FIG. 1 to form a plug contained within the plated via.

If the decision is made not to plate the via, the next step is filling the via with a conductive plug material in a volatile solvent (step 30). As in FIG. 1, any conductive compound may be used including polymer-based compounds, such as CB100 made by DuPont, Inc.

The remaining steps of evaporating the volatile solvent (step 32); removing any excess plug material from the surfaces of the circuit board layer (step 34); and curing the plug material (step 36) are as described above for step 24, step 26 and step 28 respectively of FIG. 2.

Figure 3:
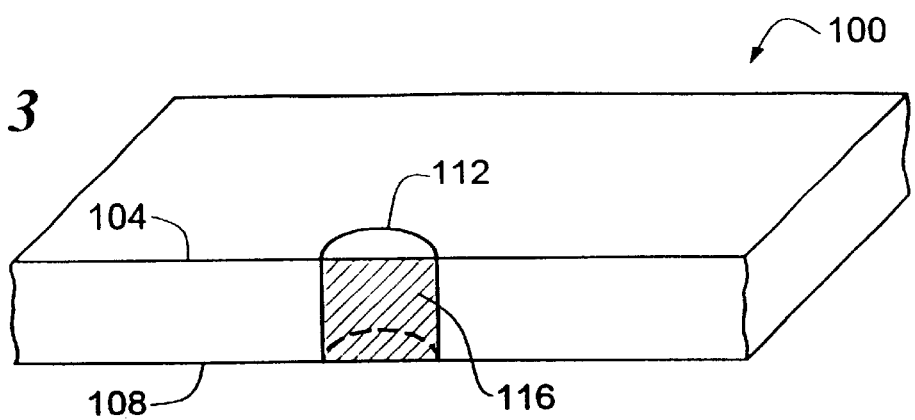
FIG. 3 is a schematic perspective cross-sectional view of an embodiment of a circuit board layer with a conductive plug formed in a via defined by the circuit board layer in accordance with the present invention.

FIG. 3 is a schematic perspective cross-sectional view of an embodiment of a circuit board layer 100 with a conductive plug 116 formed in a via 112 defined by the circuit board layer 100 in accordance with the present invention. The circuit board layer 100 has a first surface 104, a second surface 108, and defines at least one via 112 passing through the circuit board layer 100. The circuit board layer 100 may be a double sided, a multilayer or a rigid-flex circuit board layer. The circuit board layer 100 may be printed or unprinted. Optionally, the circuit board layer 100 may further comprise a base or pad (not shown) disposed along the circumference of the via on both the first surface 104 and the second surface 108 of the circuit board layer 100. These pads typically serve to facilitate connection of the conductive material contained in the via to a signal layer or electronic device. The via 112 contains a conductive plug 116.

Figure 4:
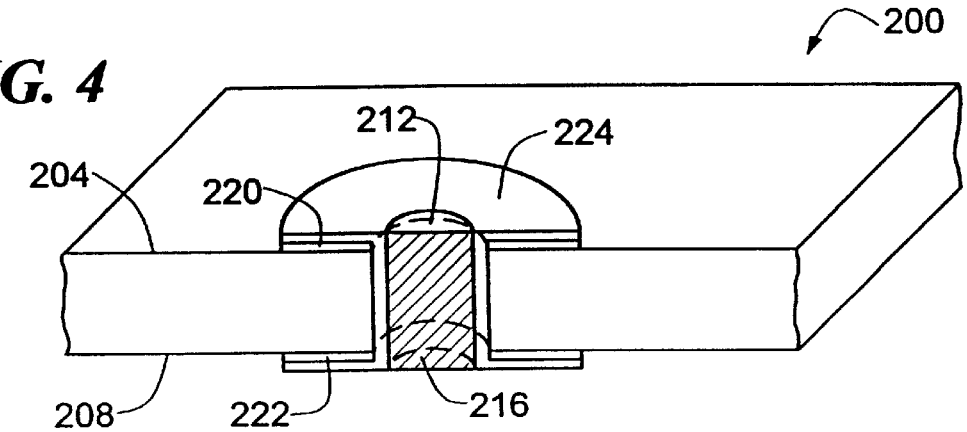
FIG. 4 is a schematic perspective cross-sectional view of an embodiment of a circuit board layer with a non-conductive plug formed in a plated via defined by the circuit board layer in accordance with the present invention.

FIG. 4 is a schematic perspective cross-sectional view of an embodiment of a circuit board layer 200 having a first surface 204, a second surface 208, and a via 212 defined by the circuit board layer 200. The circuit board layer 200 may be a double sided, a multilayer or a rigid-flex circuit board layer. The circuit board layer 200 may be printed or unprinted. The via 212 has a pair of pads 220, 222 formed around its circumference upon both the first surface 204 and the second surface 208 respectively of the circuit board layer 200. These pads typically serve to facilitate connection of the conductive material 224 contained in the via to a signal layer or electronic device. The via 212 is plated with a conductive material 224 in order to provide for the transfer of electrical signals between the first surface 204 and the second surface 208 of the circuit board layer 200. Typically the via is plated with copper, but other conductive materials may also be used in accordance with the present invention.

The via 212 also contains a non-conductive plug 216. One advantage of having the via 200 filled with a non-conductive plug 216, is that the plug 216 prevents the passage of assembly materials through the via 212. Anther advantage is that the plug 216 allows for vacuum hold down of the circuit board for testing. Yet another advantage of the plug 216 is that it serves to strengthen the circuit board layer 200.

An apparatus may be used in accordance with the present invention in order to facilitate the filling of one or more vias in a circuit board. This apparatus allows the air in the vias to be replaced by a plug material in a volatile solvent. The apparatus of the present invention is referred to as a fixture and may be used with a stencil using standard screen printing techniques.

Figure 5:
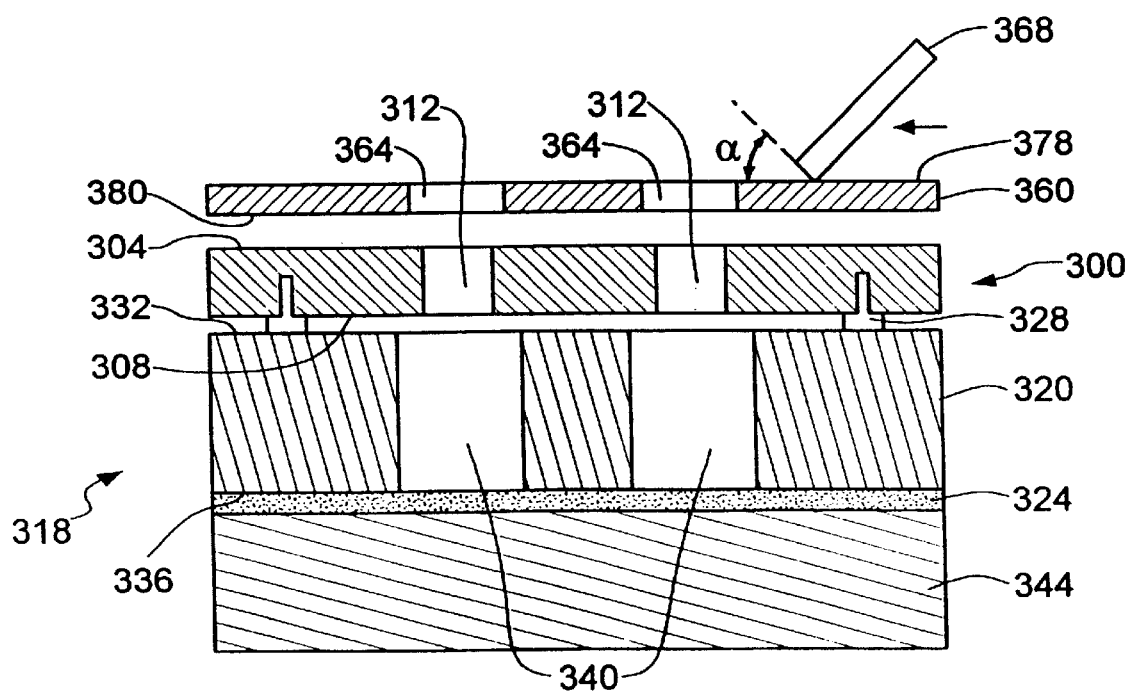
FIG. 5 is a schematic cross-sectional side view of an embodiment of an apparatus, a stencil, and a circuit board layer in accordance with the present invention.

FIG. 5 is a schematic cross-sectional side view of an embodiment of a fixture 318, holding a circuit board layer 300, and a stencil 360 in accordance with the present invention. The fixture 318 consists generally of a planar template 320, an air permeable layer 324, and a registration device 328. The planar template 320 has a first surface 332, a second surface 336, and one or more through-holes 340 passing through the template.

The template 320 may be made out of a sheet material with a thickness that is preferably greater than the thickness of the of the circuit board layer 300, so that air present in the via prior to filling may be easily displaced by plug material. For example, a 0.125 inch thick clear acrylic sheet or similar material may be used to form a template for a 0.06 inch thick circuit board in accordance with the present invention.

The through-holes 340 defined by the template 320 correspond in position to the one or more of the vias 312 defined by the circuit board layer 300 which are to be flooded with the plug material (not shown). The through-holes 340 should be larger in diameter than their corresponding vias 312 in the circuit board layer 300 so that a slight misalignment of the circuit board layer 300 and the template 320 will not cause the vias 312 to be only partially filled when flooded with plug material. Preferably, the diameters of the through-holes 340 are from about 10 mils to about 60 mils larger, more preferably from about 20 to about 50 mils larger, and most preferably are about 20 mils larger, than the diameters of the corresponding vias 312 in the printed circuit board layer 300. The through-holes 340 may be formed in the template 320 by etching, punching or drilling through the template.

The air permeable layer 324 is disposed on the second surface 336 of the template 320. The air permeable layer 324 may be a mesh screen, like a monofilament screen, a membrane or any other layer that will allow the passage of air through the layer. Preferably, the air permeable layer 324 is also substantially impermeable to the plug material, thus serving to protect the print table and any other equipment or material in the vicinity of the fixture 318 from contamination by plug material. For example, if the air permeable layer is a mesh screen, a mesh size of about 20 threads per inch to about 60 threads per inch may be used. Preferably a mesh size from about 25 thread per inch to about 30 threads per inch is used. Preferably the air permeable layer 324 is made from a material that is not degradable by the volatile solvent or any other solvent that may contact the mesh, for example, any cleaning solvents remaining on the circuit board from previous processing steps. For examples, a monofilament polyester mesh may be used in accordance with the present invention.

A registration device 328 may be used to align the circuit board layer 300 with the fixture 318 so that the one or more vias 312 of the circuit board 300 to be filled with plug material are aligned with their corresponding through-holes 340 in the template 320. This registration device 328 may be one or more registration pins attached to the first surface 332 of template 320 as shown. Alternatively, the registration device may be affixed to a printing table or the second surface 308 of the circuit board layer 300. For example, registration pins may extend upwardly out of a printing table, through the fixture entirely, and into the circuit board layer. Many equivalent registration devices are well-known in the art and may be used in accordance with the present invention. The entire fixture 318 may be held together with adhesive or adhesive tape.

When the circuit board layer 300 is disposed upon and aligned with the fixture 318, and the circuit board layer 300 is flooded with plug material, the through-holes 340 in the template 320 allow the air in the vias 312 to be displaced by the plug material, and the air permeable layer 324 allows air passage out of the fixture 318. In a preferred embodiment, the air permeable layer 324 substantially prevents any plug material that may fall through the throughholes 340 defined by the template 320 and onto the air permeable layer 324, from passing through the air permeable layer 324 and out of the fixture 318, thus avoiding possible contamination of any surrounding equipment. The fixture 318 may also include a backing or support member 344 which supports the air permeable layer 324 and the template 320. This backing 344 may be made from material of any thickness, for example, a sheet of 0.250 inch thick polypropylene or similar flat stock.

A stencil 360 may be placed over the first surface 304 of the circuit board layer 300 prior to the step of filling the one or more vias 312 of the circuit board layer 300 with plug material. The stencil 360 has a first surface 378, a second surface 380, and defines one or more through-boles 364 which correspond in position with the one or more vias 312 in the circuit board layer 300 to be filled with plug material. The stencil 360 is typically a thin stainless steel sheet and the through-holes 364 are typically etched or drilled into and through the stainless steel sheet.

The through-holes 364 of the stencil 360 may be larger in diameter than their corresponding vias 312 in the circuit board layer 300. Preferably, the diameters of the through-holes 364 are from about 2 mils to about 6 mils larger, and more preferably are 4 mils larger, than the diameter of the corresponding vias 312 in the printed circuit board layer 300. The stencil 360 is generally about 3 mils to about 10 mils thick, preferably about 4 mils to about 8 mils thick.

The stencil 360 is normally held in a fixed position relative to a print bed, for example, by a clamp. The circuit board layer 300 and the fixture 318 may be aligned with the stencil 360 by manually aligning the through-holes 364 of the stencil 360 with the vias 312 of the circuit board layer 300. Alternatively, any registration device common to screen printing machines or tables might be used to align the stencil 360 with the circuit board layer 300 and the fixture 318.

The stencil 360 may be separated from the circuit board layer 300 by an off-contact distance. This off-contact distance may be from about ⅛ inch to about ¾ inch, preferably from about ⅖ inch to about ⅜ inch in distance. The off-contact distance is important to reduce smear upon the first surface 304 of the circuit board layer 300. Smear may occur if the second surface 380 of the stencil 360 is contaminated with plug material and comes into contact with the first surface 304 of the circuit board layer 300.

The one or more vias 312 in the circuit board layer 300 may be filled by pushing plug material in a volatile solvent across a first surface 378 of the stencil 360. The material may be pushed across the stencil 360 with a squeegee 368. The squeegee may be constructed from rubber, metal, wood or the like. Preferably, the squeegee is constructed from rubber. The squeegee 368 may be passed across the surface 378 of the stencil 360 several times in order to effect the filling of the vias 312. Generally, the squeegee 368 is passed across the first surface 378 of the stencil 360 about 2 to 3 times for every 0.030 inch thickness of the circuit board layer. For example, about 4 to 6 squeegee strokes will be required for a circuit board layer that is 0.060 inches thick. Preferably, the squeegee is pushed across the first surface 378 of the stencil 360 at an angle $\alpha$ of from about 20° to about 80° with the first surface 378 of the stencil 360. Pushing the squeegee, as opposed to pulling the squeegee, and the angle between the end of the squeegee 368 in contact with the first surface 378 of the stencil 360, and the surface 378 of the stencil 360, is unique to this type of screen printing, increases the hydrostatic pressure of the plug material as it is pushed across the surface of the stencil by the squeegee, and works particularly well with the method and apparatus of the present invention.

One advantage of the using the fixture 318 and the techniques described above, is that generally, a vacuum is not required in order to fill the vias 312 of the circuit board layer 300. Because typically, vacuum apparatus is costly and requires specialized equipment, this represents a significant cost savings.

However, a vacuum assist (not shown) may be used to fill the one or more vias 312 of the circuit board layer 300 with plug material. The vacuum assist may be attached to the fixture to create a negative pressure in the space defined by the through-holes 340 in the template 320 and the air permeable layer 324. The pressure should be high enough to flood the vias 312 of the circuit board layer 300 with plug material, but not high enough to empty the one or more vias 312 of the plug material once flooded. For example, the vacuum assist might be attached to the air permeable layer 324 so that it draws air out of the fixture through the air permeable layer. Alternatively, the fixture 318 may be placed upon a vacuum table such that the air permeable layer 324 is disposed directly upon the vacuum table.

Practice of the invention will be still more fully understood from the following examples, which are presented herein for illustration purposes only and should not be construed as limiting the invention in any way.

EXAMPLE

Formation of a Non-Conductive Plug in a Circuit Board Layer

A circuit board layer was provided with a 0.062 inch thickness and with a via having a diameter of 0.012 inch. The via was plated with copper such that the diameter of the plated via was 0.010 inch. The circuit board layer was placed upon and aligned with a fixture according to the present invention. The fixture included a template with 0.061 inch through-holes formed therein, and a 25 thread per inch monofilament polyester air permeable layer. A 6 mil thick stainless steel stencil, with a through-hole having a 0.016 inch diameter formed therein, which corresponds in position to the via in the circuit board, was then visually aligned with the circuit board layer. The vias were then filled with HYSOL® SR1000 non-conductive solder mask by pushing the solder mask across the stencil with a squeegee in 4 passes at an angle of 60° with the stencil surface. No vacuum assist was necessary to completely fill the vias. The plug material was then dried for 60 minutes at 70° C. The plug material was then cured at 150° F. for 60 minutes. A 90% void free plug was achieved.

The invention may be embodied in other specific forms without departing from the spirit or essential characteristics thereof The foregoing embodiments are therefore to be considered in all respects illustrative rather than limiting of the invention described herein. Scope of the invention is thus indicated by the appended claims rather than by the foregoing description, and all changes which come within the meaning and range of equivalency of the claims are therefore intended to be embraced herein.

What is claimed is:

1. A method of forming one or more plugs in a circuit board layer comprising the steps of:
   (a) providing the circuit board layer, the circuit board layer having a first surface, a second surface, and defining a via containing a non-conductive plug material in a volatile solvent;
   (b) evaporating the volatile solvent; and
   (c) curing the non-conductive plug material.

2. The method of claim 1 wherein step (a) comprises providing the circuit board layer, the circuit board layer having a first surface, a second surface, and defining a via containing a solder mask in a volatile solvent.

3. The method of claim 1 wherein step (a) comprises:
   (a-a) providing the circuit board layer, the circuit board layer having a first surface, a second surface, and defining a via having a first diameter; and
   (a-b) filling the via with a non-conductive plug material in a volatile solvent.

4. The method of claim 3 further comprising the step of placing the circuit board layer on a fixture prior to step (a-b), the fixture comprising:
   a planar template, having a first surface, a second surface, and defining a through-hole having a second diameter and corresponding in position to the via defined by the circuit board layer;
   an air permeable layer disposed on the second surface of the template; and
   a registration device disposed on the first surface of the template for aligning the circuit board layer with the template.

5. The method of claim 4 wherein the second diameter of the through-hole defined by the template is larger than the first diameter of the via defined by the circuit board layer.

6. The method of claim 4 wherein the air permeable layer is substantially impermeable to the non-conductive plug material.

7. The method of claim 5 further comprising the step of placing a stencil over the first surface of the circuit board layer prior to step (a-b), the stencil having a first surface, a second surface, and defining a through-hole having a third diameter and corresponding in position to the via defined by the circuit board layer.

8. The method of claim 7 further comprising the step of aligning the through-hole defined by the stencil with the via defined by the circuit board layer.

9. The method of claim 7 wherein the stencil is separated from the circuit board layer by an off-contact distance.

10. The method of claim 7 wherein the third diameter of the through-hole defined by the stencil is larger than the first diameter of the via defined by the circuit board layer.

11. The method of claim 7 wherein step (a-b) comprises filling the via with a non-conductive plug material in a volatile solvent by pushing the non-conductive plug material across the first surface of the stencil with a squeegee.

12. The method of claim 11 wherein step (a-b) further comprises using a vacuum to assist filling the via with the non-conductive plug material in the volatile solvent.

13. The method of claim 1 wherein step (b) comprises evaporating the volatile solvent at a controlled rate, such that the creation of one or more voids in the non-conductive plug material is minimized.

14. The method of claim 1 further comprising the step of removing any non-conductive plug material disposed on the first surface of the circuit board layer prior to step (c).

15. The method of claim 1 further comprising the step of removing any non-conductive plug material disposed on the first surface and the second surface of the circuit board layer prior to step (c).

16. The method of claim 1 further comprising the step of removing any non-conductive plug material disposed on the first surface and the second surface of the circuit board layer by brushing the first surface and the second surface of the circuit board layer with a nylon roller brush prior to step (c).

17. A fixture for filling a via having a first diameter formed in a circuit board layer, the fixture comprising:
   a planar template, having a first surface, a second surface, and defining a through-hole having a second diameter and corresponding in position to the via formed in the circuit board layer;
   an air permeable layer disposed on the second surface of the template; and
   a registration device disposed on the first surface of the template for aligning the circuit board layer with the template.

18. The fixture of claim 17 wherein the second diameter of the through-hole defined by the template is larger than the first diameter of the via defined by the circuit board layer.

19. The fixture of claim 17 wherein the air permeable layer comprises a mesh screen.

20. The fixture of claim 17 further comprising a vacuum assist.

* * * * *